(12) United States Patent
Fukuda

(10) Patent No.: US 8,445,321 B2
(45) Date of Patent: May 21, 2013

(54) SEMICONDUCTOR DEVICE AND METHOD OF MANUFACTURING THE SAME

(75) Inventor: Masatoshi Fukuda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 279 days.

(21) Appl. No.: 12/887,772

(22) Filed: Sep. 22, 2010

(65) Prior Publication Data

US 2011/0074018 A1    Mar. 31, 2011

(30) Foreign Application Priority Data

Sep. 30, 2009    (JP) ............................ P2009-228833

(51) Int. Cl.
*H01L 21/44* (2006.01)
*H01L 21/48* (2006.01)
*H01L 21/50* (2006.01)

(52) U.S. Cl.
USPC ........... 438/108; 438/112; 438/124; 257/737; 257/750

(58) Field of Classification Search
USPC ................ 438/108, 112, 124; 257/737, 750, 257/759, E25.027
See application file for complete search history.

(56) References Cited

U.S. PATENT DOCUMENTS

| | | | |
|---|---|---|---|
| 6,689,639 B2 * | 2/2004 | Sakuyama et al. | 438/118 |
| 7,649,257 B2 * | 1/2010 | Gordon et al. | 257/737 |
| 2005/0199994 A1 | 9/2005 | Morishita et al. | |
| 2005/0227474 A1 * | 10/2005 | Mizukoshi et al. | 438/612 |
| 2007/0141750 A1 | 6/2007 | Iwasaki et al. | |
| 2008/0248611 A1 * | 10/2008 | Hanada et al. | 438/108 |
| 2010/0078830 A1 | 4/2010 | Katsurayama et al. | |
| 2010/0102446 A1 | 4/2010 | Katsurayama et al. | |
| 2010/0123250 A1 * | 5/2010 | Schulz et al. | 257/773 |

FOREIGN PATENT DOCUMENTS

| | | |
|---|---|---|
| EP | 2 079 108 | 7/2009 |
| EP | 2 096 671 | 9/2009 |
| JP | 2001-144228 | 5/2001 |
| JP | 2005-260053 | 9/2005 |
| JP | 2007-165671 | 6/2007 |
| JP | 2008-078385 | 4/2008 |
| JP | 2009158706 | 7/2009 |
| WO | 2008/054011 | 5/2008 |

OTHER PUBLICATIONS

Japanese Office Action for Japanese Application No. 2009-228833 mailed on Dec. 27, 2011.
Japanese Office Action for Japanese Application No. 2009-228833 mailed on Aug. 28, 2012.

* cited by examiner

*Primary Examiner* — Phuc Dang
(74) *Attorney, Agent, or Firm* — Turocy & Watson, LLP

(57) ABSTRACT

In one embodiment, a method of manufacturing a semiconductor device is disclosed. The method includes forming a cured film of an insulation resin on a surface of a first semiconductor chip and flip-chip bonding a second semiconductor via a bump on the first semiconductor chip on which the cured film of the insulation resin is formed. The insulation resin can be cured at temperature range from $(A-50)°$ C. to $(A+50)°$ C., wherein "A" is a solidification point of the bump.

19 Claims, 4 Drawing Sheets

SEMICONDUCTOR DEVICE AND METHOD OF MANUFACTURING THE SAME

CROSS-REFERENCE TO RELATED APPLICATION

This application is based upon and claims the benefit of priority from the prior Japanese Patent Application No. 2009-228833, filed on Sep. 30, 2009; the entire contents of which are incorporated herein by reference.

FIELD

Embodiments described herein relate generally to a semiconductor device and a method of manufacturing the same.

BACKGROUND

As a technology for achieving high performance, multifunction and compactness of an electronic device such as a mobile device, there is known a so-called chip on chip (COC) technology in which a plurality of semiconductor chips such as a memory chip and a logic chip are stacked in three dimensions. Among semiconductor devices manufactured by utilizing the COC technology, a semiconductor device in which two semiconductor chips are flip-chip bonded is advantageous for achieving compactness, speeding up of data transfer between chips, and so on, and is often used in various electronic devices.

Conventionally, a semiconductor device with a COC structure using such flip-chip bonding is manufactured by bonding terminals of respective surfaces (circuit formation surfaces) of two semiconductor chips via solder bumps and thereafter filling an underfill material therebetween. The solder bumps are formed on terminals of at least one of the semiconductor chips and the solder bumps are molten by reflow processing and bonded. Lead-free solder, for example, SnCu, or SnAg, which does not include Pb, is generally used for the solder bumps in view of environment conservation. The reflow processing is performed, for example, at a peak temperature of 240-260° C., which is 20-30° C. higher than the melting temperatures of above lead-free solders.

However, in such a semiconductor device manufactured by an existing method, warpage of the two semiconductor chips occurs due to influence of an insulation film or the like formed on the surface of the semiconductor chip as a protection film, each bonded part of the bumps being compressed or tensioned. This may result in a connection failure (short circuit or open circuit). In particular, an organic film, for example, polyimide film, having cure temperature of about 350° C. to 380° C., has been often used as an insulation film because of its excellence in a trap function for dust such as Si. In this case, warpage becomes minimum at the cure temperature, increasing as a temperature goes down, sometimes reaching 30 μm at the temperature at which the solder bumps solidifies (for example, solidification point of SnAg solder is about 221° C.), so that the connection failure at bonded parts of the bumps as described above tends to occur easily. Thus, a technology suppressing occurrence of warpage of a semiconductor chip is required.

Relating to such a kind of technology, there is disclosed, for example, in JP-A 2009-158706 (KOKAI), a method for suppressing deformation of a semiconductor package due to a difference in thermal expansion between a sealing material and a package substrate. However, since this method is to suppress deformation of the semiconductor package in mounting to a motherboard, a method for solving the above-described problem in a semiconductor device with a COC structure has not been found yet.

DETAILED DESCRIPTION

In one embodiment, a method of manufacturing a semiconductor device is disclosed. The method comprises forming a cured film of an insulation resin on a surface of a first semiconductor chip and flip-chip bonding a second semiconductor via a bump on the first semiconductor chip on which the cured film of the insulation resin is formed. The insulation resin can be cured at temperature range from $(A-50)°$ C. and to $(A+50)°$ C. wherein "A" is a solidification point of the bump.

First Embodiment

Figure 1:
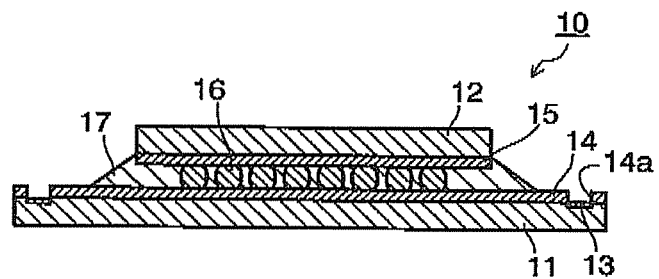
FIG. 1 is a cross-sectional view showing a schematic configuration of a semiconductor device of a first embodiment.

FIG. 1 is a cross-sectional view showing a schematic configuration of a semiconductor device manufactured according to the present embodiment. The semiconductor device 10 has a COC structure in which a second semiconductor chip 12 is flip-chip bonded on a first semiconductor chip 11. The first semiconductor chip 11 is a logic chip, while the second semiconductor chip 12 is a memory chip.

The first semiconductor chip 11 includes an electrode pad (electrode) 13 and an insulation resin cured film (first insulation resin cured film) 14 having an opening portion 14a provided to expose a surface of the electrode pad 13. On the other hand, the second semiconductor chip 12 includes an insulation resin cured film (third insulation resin cured film) 15 on a surface (terminal surface).

Further, both terminal surfaces of the first semiconductor chip 11 and the second semiconductor chip 12 are bonded via solder bumps 16, and an underfill material 17 is filled in a space therebetween. The solder bumps 16 are formed on respective terminal portions (not shown) of the first semiconductor chip 11 and the second semiconductor chip 12 and bonded integrally by reflow processing.

The solder bumps 16 may be formed of metal material having solidification point from 220° C. to 240° C., such as SnAg (solidification point: 221° C.) SnCu (solidification point: 227° C.), Sn (solidification point: 232° C.), for example. The bump diameters and the bump pitches are about 5 μm to 50 μm and about 10 μm to 100 μm respectively, for example.

Further, for the insulation resin cured films 14, 15, an insulation resin such as ELPAC WPR-1020 or ELPAC WPR- 5100 (these are brand names of photosensitive insulation resins) from JSR Corp for example may be used, and the insulation resin cured films 14, are formed by curing the above insulation resin, for example, for about one hour at temperature range from (A−50)° C. to (A+50)° C., wherein "A" is the solidification point of the material forming the solder bumps 16. Cure temperature range of the insulation resin is preferably from (A−25)° C. to (A+25)° C., and is more preferably around A° C., that is, around the solidification point of the material forming the solder bumps 16.

A peripheral edge portion of the first semiconductor chip 11 is exposed more outside than the outer periphery of the second semiconductor chip 12, and the electrode pad 13 is formed on a surface of that exposed peripheral edge portion.

A method of manufacturing the semiconductor device 10 will be described.

First, an insulation resin such as ELPAC WPR-1020 or ELPAC WPR-5100 is applied by spin coating to a surface of the first semiconductor chip 11 on which an electrode pad 13 is formed, and cured, for example, for about one hour at temperature range from (A−50)° C. to (A+50)° C., wherein, "A" is the solidification point of the bump forming material, preferably at temperature range from (A−25)° C. to (A+25)° C. or more preferably at around A° C., to form an insulation resin cured film 14, and thereafter, each upper part of terminal portions and an upper part of the electrode pad 13 are made open by lithography and then solder bumps 16 are formed on the terminal portions. The multistep curing at different temperatures including the temperature range described above (for example, 150° C.×30 minutes+250° C.×30 minutes, or the like) can be used for curing the insulation resin. Therefore, "curing" in the present specification includes such "multistep curing".

Further, an insulation resin such as ELPAC WPR-1020 or ELPAC WPR-5100 is applied to the surface of a second semiconductor chip 12 by spin coating similarly to a case of the above-described insulation resin cured film 14, and cured, for example, for about one hour at temperature range from (A−50)° C. to (A+50)° C., (wherein "A" is the solidification point of the bump material), preferably at temperature range from (A−25)° C. to (A+25)° C., or more preferably at around A° C. to form an insulation resin cured film 15, and thereafter, each upper part of terminal portions is made open by lithography, and then solder bumps 16 are formed on the terminal portions.

Next, after the second semiconductor chip 12 is flip-chip bonded on the first semiconductor chip 11, the solder bumps 16 are reflowed with flux, or under a reducing atmosphere containing hydrogen or formic acid, preferably at temperature range from (A+10)° C. to (A+40)° C., more preferably from (A+15)° C. to (A+35)° C., at temperature range, for example, from 240° C. to 260° C., so that an oxidized film of the solder bumps 16 is removed and the solder bumps 16 are molten, and then the temperature is lowered thereby to solidify the solder bumps 16. On this occasion, since cure temperatures of the insulation resin cured films 14, 15 formed on the surfaces of the first semiconductor chip 11 and the second semiconductor chip 12 are within a range of ±50° C. of the solidification point A of the solder bumps 16, the curing contraction does not occur as significantly as the case of curing at higher temperatures. Thus, warpage does not occur significantly to the first semiconductor chip 11 nor to the second semiconductor chip 12. Therefore, a compression or tension stress in each bonded part in the solder bumps 16 is decreased, whereby occurrence of a connection failure such as a short circuit or an open circuit is suppressed.

Figure 2:
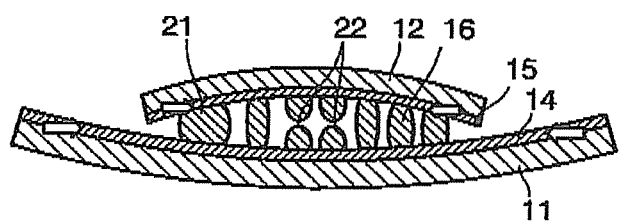
FIG. 2 is a cross-sectional view showing connection failures of a semiconductor device caused by warpage of semiconductor chips.

FIG. 2 is a cross-sectional view showing a state of a occurrence of a short circuit 21 due to a large compression stress acting on bumps 16 placed outside and a open circuit 22 due to a tension stress acting on solder bumps 16 placed inside, which is caused by a fact that because cure temperatures of insulation resin cured films 14,15 are more than 50 degrees higher than the solidification point of the material forming solder bumps 16, large warpage in concaved shape and in convexed shape occurs to the first semiconductor chip 11 and the second semiconductor chip 12 respectively at the time of solidification of the solder bumps 16.

After the first semiconductor chip 11 and the second semiconductor chip 12 are bonded via the solder bumps 16 as stated above, an underfill material 17 is filled in a space between the first semiconductor chip 11 and the second semiconductor chip 12 and heated at predetermined temperature to be cured. Thereby, the semiconductor device 10 shown in FIG. 1 is completed.

Figure 3:
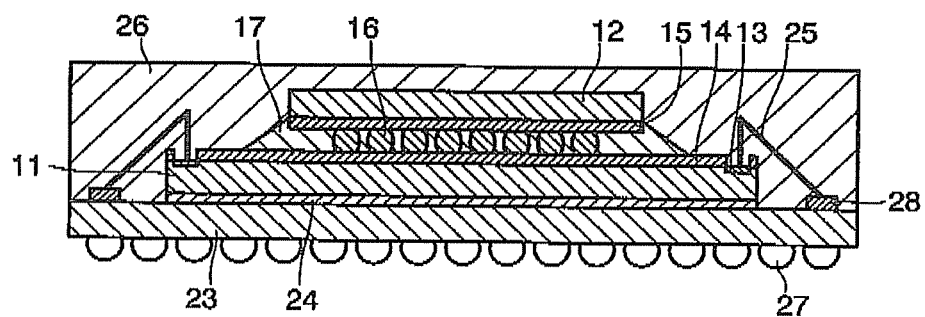
FIG. 3 is a cross-sectional view showing a schematic configuration of a semiconductor package using the semiconductor device shown in FIG. 1.

As shown in FIG. 3, in the semiconductor device 10 the lower surface of the first semiconductor chip 11 is adhered on a mounting substrate 23 such as an interposer substrate by using a die attach material 24 and an electrode pad 13 on the first semiconductor chip 11 is electrically connected via a bonding wire 25 to a terminal 28 on the mounting substrate 23 such as an interposer substrate, and the first semiconductor chip 11 and the second semiconductor chip 12 on the mounting substrate 23 are sealed with molding resin 26. In FIG. 3, a reference number 27 indicates an external connection terminal formed on a lower surface of the mounting substrate 23.

According to the present embodiment, since the insulation resin cured film 14, 15 on the respective surfaces of the first semiconductor chip 11 and the second semiconductor chip 12 are cured at the temperatures within the range of ±50° C. from the solidification point A of the material forming the solder bump 16, it is possible to suppress occurrence of warpage of the first semiconductor chip 11 and the second semiconductor chip 12 at the time of solidification of the solder bump 16 and thereby it is possible to suppress occurrence of the connection failure such as a short circuit or an open circuit at bonded parts of the solder bumps 16.

Though the cured films made of the insulation resins are formed on both surfaces of the first semiconductor chip 11 and the second semiconductor chip 12 according to the present embodiment, it is possible that a cured film made of an insulation resin is formed on either surface of the first semiconductor chip 11 or the second semiconductor chip 12 and an insulation film made of an inorganic material is formed on the other surface. In a semiconductor device configured as above, warpage of a semiconductor chip due to a cured film made of an insulation, resin can also be suppressed and occurrence of a connection failure such as a short circuit and an open circuit at bonded parts of solder bumps 16 can be suppressed.

Second Embodiment

Figure 4:
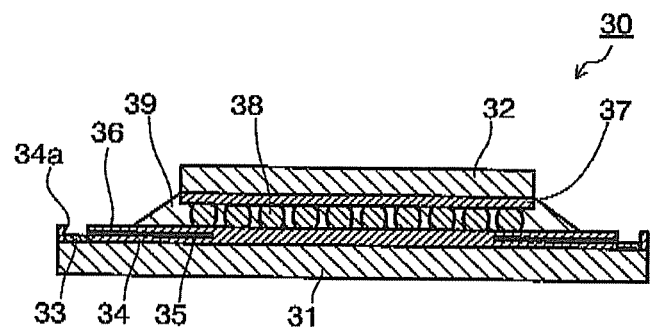
FIG. 4 is a cross-sectional view showing a schematic configuration of a semiconductor device of a second embodiment.

FIG. 4 is a cross-sectional view showing a schematic configuration of a semiconductor device manufactured according to the second embodiment. The semiconductor device 30 has a COC structure in which a second semiconductor chip 32 is flip-chip bonded on a first semiconductor chip 31. The first semiconductor chip 31 is a memory chip while the second semiconductor chip 32 is a logic chip.

The first semiconductor chip 31 includes an electrode pad 33, an insulation resin cured film (first insulation resin cured film) 34 having an opening portion 34a on the electrode pad 33, a redistribution layer (interconnection) 35 electrically connected to the electrode pad 33, and an insulation resin cured film (second insulation resin cured film) 36 having an opening portion (bump formation portion) on the redistribution layer 35. On the other hand, the second semiconductor chip 32 includes an insulation resin cured film (third insulation resin cured film) 37 on the surface (terminal surface).

The terminal surfaces of first semiconductor chip 31 and the second semiconductor chip 32 are bonded by respective terminal surfaces via solder bumps 38 and an underfill material 39 is filled in a space therebetween. The solder bumps 38 are formed on the redistribution layer 35 as well as terminal portions of the first semiconductor chip 31 and on terminal portions of the second semiconductor chip 32, which are then bonded by reflow processing.

The solder bumps 38 may be formed of metal material having solidification point from 220° C. to 240° C. such as SnAg (solidification point 221° C.), SnCu (solidification point: 227° C.) and Sn (solidification point 232° C.). The bump diameters and the bump pitches are, for example, about 5 µm to 50 µm and about 10 µm to 100 µm, respectively.

Further the insulation resin cured films 34, 36, and 37 are formed from insulation resin such as ELPAC WPR-1020 or ELPAC WPR-5100 by curing the resin, for example, for about one hour at temperature range from (A−50)° C. to (A+50)° C., wherein "A" is the solidification point of the material forming the solder bumps 38. Cure temperature range of the insulation resin is preferably from (A−25)° C. to (A+25)° C., and is more preferably around A° C., that is, around the solidification point of the material forming the solder bumps 38.

The redistribution layer (interconnection) 35 in the first semiconductor chip 31 is provided for leading an input/output signal from the logic chip, ie, the second semiconductor chip 32 to the outside. In other words, the input/output signal from the logic chip, ie, the second semiconductor chip 32 is led to the outside via the electrode pad 33 which is electrically connected to the redistribution layer 35 and which is provided on a peripheral edge portion of the first semiconductor chip 31.

A method of manufacturing the semiconductor device 30 will be described. An example is described here, wherein Al is used as a material of the electrode pad 33 and Cu is used as a material of the redistribution layer 35.

Figure 5A:
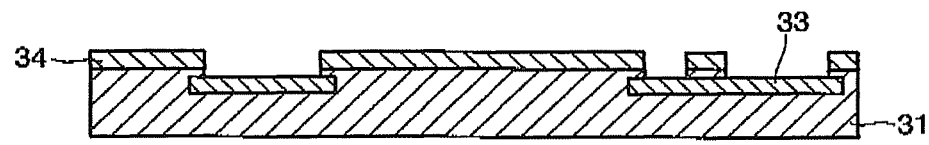
FIG. 5A to FIG. 5J are cross-sectional views showing a manufacturing process of the semiconductor device according to the second embodiment.

First, as shown in FIG. 5A, an insulation resin such as ELPAC WPR-1020 or ELPAC WPR-5100 (these are brand names of photosensitive insulation resins) is applied by spin coating to a surface of the first semiconductor chip 31 on which an Al electrode pad 33 is formed, and cured, for example, for about one hour at temperature range from (A−50)° C. to (A+50)° C., wherein "A" is the solidification point of the bump material), preferably at temperature range from (A−25)° C. to (A+25)° C., or more preferably at around A° C., that is, around the solidification point of the bump material to form an insulation resin cured film 34, and thereafter, upper parts of terminal portions and an upper part of the Al electrode pad 33 are made open by using lithography.

Figure 5B:
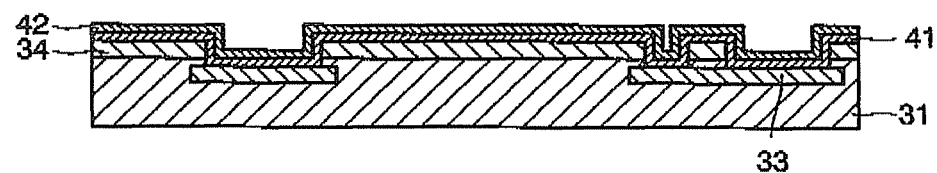

Next, as shown in FIG. 5B, a Ti film 41 and a Cu film 42 are sequentially formed thereon by sputtering.

Figure 5C:
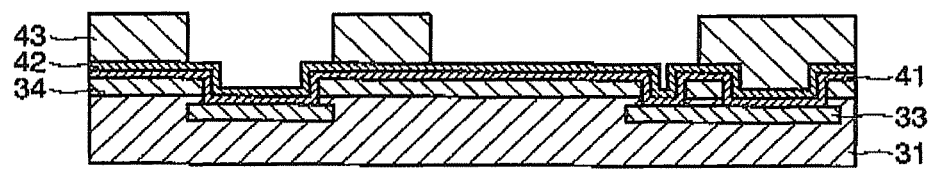

Next, as shown in FIG. 5C, a resist film 43 with openings for bump and redistribution layer formation portions is formed by using lithography after applying a resist by spin coating.

Figure 5D:
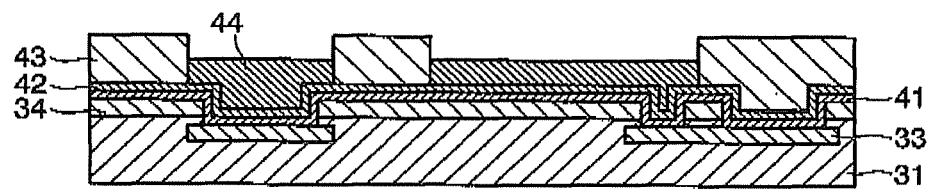

Next, as shown in FIG. 5D, a Cu plating 44 is applied to the bump formation portions and the redistribution layer formation portion.

Figure 5E:
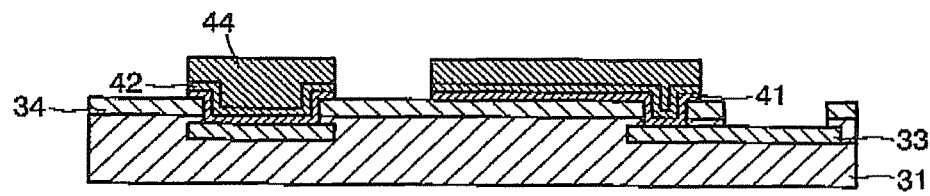

Next, as shown in FIG. 5E, after the resist film 43 is removed, the unnecessary Ti film 41 and Cu film 42 are removed by using etching and ashing techniques.

Figure 5F:
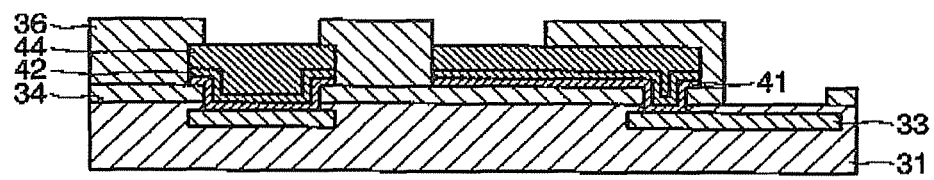

Next, as shown in FIG. 5F, an insulation resin such as ELPAC WPR-1020 or ELPAC WPR-5100 is applied by spin coating and cured, for example, for about one hour at temperature range from (A−50)° C. to (A+50)° C., wherein "A" is the solidification point of the bump material, preferably at temperature range from (A−25)° C. to (A+25)° C., or more preferably at around AC to form an insulation resin cured film 36, and thereafter, the bump formation portions and the Al electrode pad 33 for wire bonding are opened by using lithography.

Figure 5G:
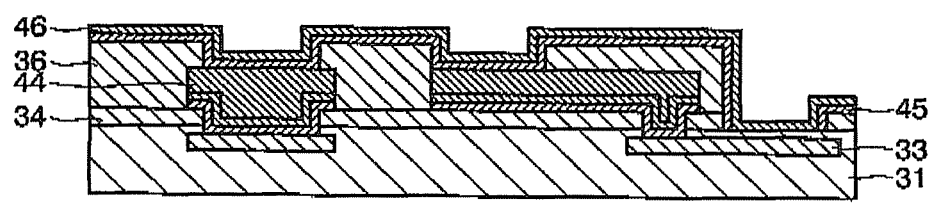

Next, as shown in FIG. 5G, a Ti film 45 and a Cu film 46 are sequentially formed thereon by sputtering.

Figure 5H:
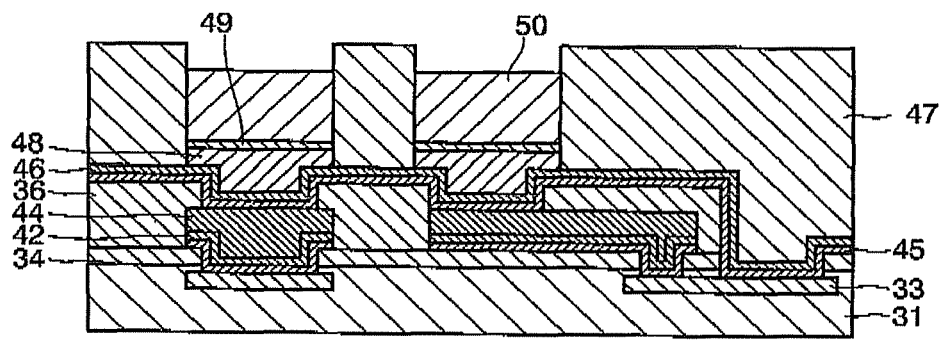

Next, as shown in FIG. 5H, a resist film 47 with openings for bump formation portions is formed by lithography after applying a resist by spin coating, and then Ni 48, Cu 49 and Sn 50 are sequentially plated on the bump formation portions.

Figure 5I:
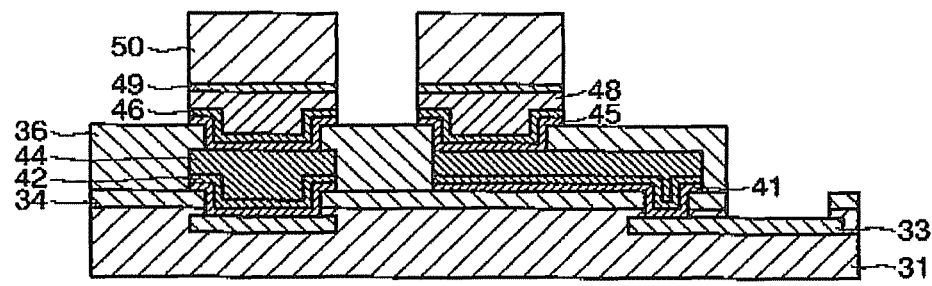

Next, as shown in FIG. 5I, after the resist film 47 is removed, the unnecessary portions of Ti film 45 and Cu film 46 are removed by etching and ashing techniques.

Figure 5J:
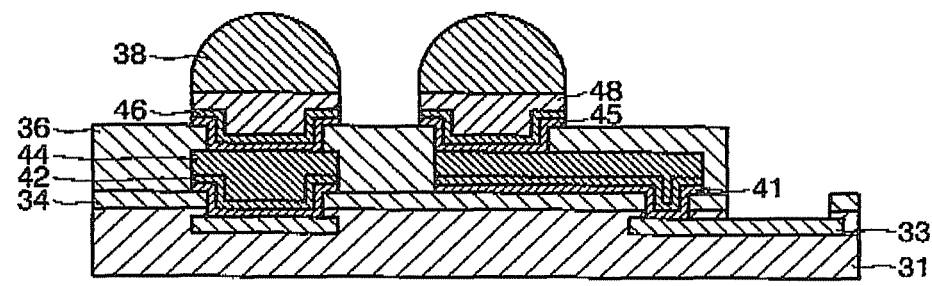

Next, as shown in FIG. 5J, a flux is applied on a surface of the plated Sn 50 and reflowing is performed, so that Cu 49 and Sn 50 are molten to form SnCu solder bumps 38.

On the other hand, an insulation resin such as ELPAC WPR-1020 or ELPAC WPR-5100 is applied to a surface of a second semiconductor chip 32 by spin coating similarly to a case of the above-described insulation resin cured films 34, 36, and cured, for example, for about one hour at temperature range from (A−50)° C. to (A+50)° C., (wherein, "A" is the solidification point of the bump material), preferably at temperature range from (A−25)° C. to (A+25)° C., or more preferably at around AC to form an insulation resin cured film 37, and thereafter, upper parts of terminal portions are opened by using lithography, and then solder bumps 38 are formed on the terminal portions.

Next, after the second semiconductor chip 32 is flip-chip bonded on the first semiconductor chip 31, the solder bumps 38 are reflowed with flux, or under a reducing atmosphere containing hydrogen, formic acid or the like, preferably at temperature range from (A+10)° C. to (A+40)° C., more preferably from (A+15)° C. to (A+35)° C., at temperature range from 240° C. to 260° C., for example, so that an oxidized film of the solder bumps 38 is removed and the solder bumps 38 is molten, and then the temperature is lowered thereby to solidify the solder bumps 38. On this occasion, since cure temperatures of the insulation resin cured films 34, 36, 37 formed on the surfaces of the first semiconductor chip 31 and the second semiconductor chip 32 are within a range of ±50° C. of the solidification point A of the solder bumps 38, warpage does not occur significantly to the first semiconductor chip 31 nor the second semiconductor chip 32. Therefore, a compression or tension stress in a bonded part in the solder bumps 38 is decreased, whereby occurrence of a connection failure such as a short circuit or an open circuit is suppressed.

In particular, in the present embodiment, the redistribution layer 35 is formed in the first semiconductor chip 31, and in a semiconductor chip in which such a redistribution layer 35 is formed, an influence of insulation resin cured films 34, 36 is large, leading to easy occurrence of warpage in the semiconductor chip. However, even in the semiconductor chip in which such a redistribution layer 35 is formed, occurrence of warpage is suppressed since cure temperatures of the insulation resin cured films 34, 36 are within the range of ±50° C. from the solidification point A of the solder bumps 38. Therefore, occurrence of a connection failure such as a short circuit or an open circuit at bonded parts of the solder bumps 38 is suppressed.

Thus, after the first semiconductor chip 31 and the second semiconductor chip 32 are bonded via the solder bumps 38, an underfill material 39 is filled in a space between the first semiconductor chip 31 and the second semiconductor chip 32, heated at predetermined temperature to be cured. Thereby, the semiconductor device 30 as shown in FIG. 4 is completed.

Figure 6:
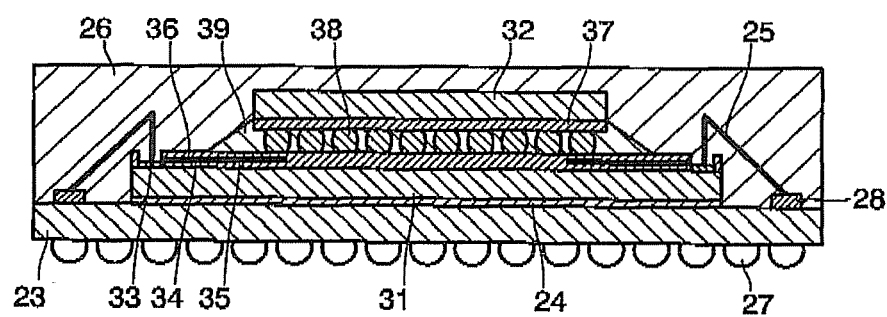
FIG. 6 is a cross-sectional view showing a schematic configuration of a semiconductor package using the semiconductor device shown in FIG. 4.

As shown in FIG. 6, in the semiconductor device 30 also, similarly to in the semiconductor device 10 manufactured in the first embodiment, a lower surface of the first semiconductor chip 31 is adhered on a mounting substrate 23 such as an interposer substrate by using a die attach material 24, and an electrode pad 33 on the first semiconductor chip 31 is electrically connected to a terminal 28 on the mounting substrate 23 such as an interposer substrate via a bonding wire 25, and the first semiconductor chip 31 and the second semiconductor chip 32 on the mounting substrate 23 are sealed with molding resin 26. In FIG. 6, a reference number 27 indicates an external connection terminal formed on a lower surface of the mounting substrate 23.

According to the present embodiment, since the insulation resin cured films 34, 36, 37 on the respective surfaces of the first semiconductor chip 31 and the second semiconductor chip 32 are cured at temperatures within the range of 50° C. from the solidification point A of the material forming the solder bumps 38, it is possible to suppress warpage in the first semiconductor chip 31 and the second semiconductor chip 32 when the solder bumps 38 are solidified, and thereby it is possible to suppress occurrence of a connection failure such as a short circuit or an open circuit at bonded parts of the solder bumps 38.

Also in the present embodiment, though the cured film made of the insulation resin are formed on both surfaces of the first semiconductor chip 31 and the second semiconductor chip 32 similarly to the case of the first embodiment, it is possible that a cured film made of an insulation resin is formed on either surface of the first semiconductor chip 31 or the second semiconductor chip 32 and an insulation film made of an inorganic material is formed on the other surface. Also in a semiconductor device configured as above, warpage of a semiconductor chip due to a cured film made of an insulation resin can be suppressed and occurrence of a connection failure such as a short circuit and an open circuit at bonded parts of the solder bumps 38 can be suppressed.

There are described an experiment conducted for investigating an effect of cure temperature of an insulation resin on warpage of a semiconductor chip or on occurrence of a connection failure of a semiconductor device and a result of the experiment.

In the experiment, there were investigated, for a semiconductor device manufactured similarly to a case of the second embodiment except that cure temperature of an insulation resin was varied, warpage amount (at the time of solidification of a solder bump) occurred in a first semiconductor chip and a warpage direction (a shape of warpage when a semiconductor element surface was faced upward) thereof, and further an occurrence rate of a connection failure (number of failures/total number of samples) of the semiconductor device. SnCu (solidification point: 227° C.) was used for the solder bump, and for insulation resins, ELPAC WPR-5100 from JSR Corp. was used in No. 1 to No. 7 and PW-1500 (brand name of a polyimide resin) from TORAY Corp. was used only in No. 8. Results are shown in Table 1.

TABLE 1

| No. | 1 | 2 | 3 | 4 | 5 | 6 | 7 | 8 |
|---|---|---|---|---|---|---|---|---|
| cure temperature of insulation resin (° C.) | 150 (A − 77) | 177 (A − 50) | 202 (A − 25) | 227 (A) | 252 (A + 25) | 277 (A + 50) | 300 (A + 73) | 350 (A + 123) |
| Warpage amount of semiconductor chip at 227° C. (μm) | about 15 | 5 to 10 | 0 to 5 | 0 to 5 | 0 to 5 | 5 to 10 | about 20 | about 30 |
| Direction of warpage | convex | convex | convex | convex/ concave | concave | concave | concave | concave |
| occurrence rate of connection failure (number of failures/ total number of samples) | 10/30 | 1/30 | 0/30 | 0/30 | 0/30 | 1/30 | 10/30 | 30/30 |

As is obvious from Table 1, in the semiconductor devices (No. 2 to No. 6) in which the insulation resins were cured at temperatures within a range of ±50° C. from the solidification point A of the material forming the solder bumps, the warpage amount of the semiconductor chips were small and occurrence rates of connection failures were quite small. In particular, in the semiconductor devices (No. 3 to No. 5) in which the insulation resins were cured at temperatures within a range of ±25° C. from the solidification point A of the material forming the solder bumps, the warpage amount of the semiconductor chips were smaller and the occurrence of the connection failures is zero. Thereby, it is confirmed that in order to suppress occurrence of warpage of a semiconductor chip and to suppress occurrence of a connection failure, it is preferable that cure temperatures of an insulation resin are within a range of ±50° C. from the solidification point of the material forming the solder bumps and it is more preferable that cure temperatures of the insulation resin is within a range of ±25° C. from the solidification point of the material forming the solder bumps.

While certain embodiments have been described, these embodiments have been presented by way of example only, and are not intended to limit the scope of the inventions. Indeed, the novel devices and methods described herein may be embodied in a variety of other forms; furthermore, various omissions, substitutions, and changes in the form of the devices and methods described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, comprising:
   (a) forming, on a surface of a first semiconductor chip having an electrode, a first insulation resin cured film having an opening portion on the electrode;
   (b) forming an interconnection electrically connected to the electrode on the first semiconductor chip on which the first insulation resin cured film is formed;
   (c) forming a second insulation resin cured film having an opening portion on the interconnection;
   (d) flip-chip bonding a second semiconductor chip on the first semiconductor chip on which the first insulation resin cured film is formed via a bump,
   wherein at least one of a first insulation resin comprising the first insulation resin cured film or a second insulation resin comprising the second insulation resin cured film is cured at a temperature from $(A-50)°$ C. to $(A+50)°$ C., and "A" is a solidification point of the bump.

2. The method of claim 1, wherein in the (a), the first insulation resin is cured at a temperature from $(A-25)°$ C. to $(A+25)°$ C.

3. The method of claim 1, wherein in the (a), the first insulation resin is cured at around $A°$ C.

4. The method of claim 1, wherein in the (c), the second insulation resin is cured at a temperature range from $(A-50)°$ C. to $(A+50)°$ C.

5. The method of claim 1, further comprising:
   (e) before the (d), forming a third insulation resin cured film on a surface of the second semiconductor chip.

6. The method of claim 5, wherein in the (e), a third insulation resin comprising the third insulation resin cured film is cured at a temperature range from $(A-50)°$ C. to $(A+50)°$ C.

7. The method of claim 1, wherein the (d) comprises reflowing the bump for bonding.

8. The method of claim 1, wherein the (d) comprises reflowing the bump for bonding at temperature range from $(A+10)°$ C. to $(A+40)°$ C.

9. The method of claim 1, wherein the (d) comprises reflowing the bump for bonding at temperature range from 240° C. to 260° C.

10. The method of claim 1, wherein the bump is made of a metal material having a solidification point A from 220° C. to 240° C.

11. The method of claim 1, wherein a diameter and a pitch of the bump are 5 μm to 50 μm and 10 μm to 100 μm, respectively.

12. The method of claim 1, wherein at least one of the first insulation resin or the second insulation resin is a photosensitive insulation resin.

13. The method of claim 1, wherein a peripheral edge portion of the first semiconductor chip is exposed more outside than an outer periphery of the second semiconductor chip, and the electrode is formed on a surface of that exposed peripheral edge portion.

14. The method of claim 1, wherein the first semiconductor chip is a memory chip and the second semiconductor chip is a logic chip.

15. The method of claim 1, wherein the first semiconductor chip is a logic chip and the second semiconductor chip is a memory chip.

16. A semiconductor device comprising:
   a first semiconductor chip on which an electrode is formed;
   a first insulation resin cured film formed on a surface of the first semiconductor chip and having an opening portion on the electrode;
   an interconnection formed on the first semiconductor chip on which the first insulation resin cured film is formed, the interconnection being electrically connected to the electrode;
   a second insulation resin cured film having an opening portion on the interconnection; and
   a second semiconductor chip bonded via a bump on the first semiconductor chip on which the second insulation resin cured film is formed,
   wherein at least one of the first insulation resin cured film and the second resin cured film are formed by curing an insulation resin comprising the first insulation resin cured film and the second insulation resin cured film at temperature range from $(A-50)°$ C. to $(A+50)°$ C., wherein, "A" is a solidification point of the bump.

17. The semiconductor device of claim 16, wherein the bump is bonded by reflow.

18. The semiconductor device of claim 16, wherein the bump is made of a metal material having a solidification point "A" from 220° C. to 240° C.

19. The semiconductor device of claim 16, wherein at least one of the first insulation resin cured film and the second insulation resin cured film are formed by curing an insulation resin at a temperature range from $(A-25)°$ C. to $(A+25)°$ C.

* * * * *